(12) United States Patent
Goodwin

(10) Patent No.: US 12,418,301 B2
(45) Date of Patent: Sep. 16, 2025

(54) RECOVERY CIRCUIT

(71) Applicant: NORTHROP GRUMMAN SYSTEMS CORPORATION, Falls Church, VA (US)

(72) Inventor: Shaun Mark Goodwin, East New Market, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 386 days.

(21) Appl. No.: 18/314,546

(22) Filed: May 9, 2023

(65) Prior Publication Data

US 2024/0380304 A1    Nov. 14, 2024

(51) Int. Cl.
*H03M 1/12* (2006.01)
*H02M 1/00* (2006.01)
*H02M 1/08* (2006.01)
*H02M 1/12* (2006.01)

(52) U.S. Cl.
CPC ............ *H03M 1/12* (2013.01); *H02M 1/0022* (2021.05); *H02M 1/0048* (2021.05); *H02M 1/08* (2013.01); *H02M 1/126* (2013.01)

(58) Field of Classification Search
CPC .... H03M 1/12; H02M 1/0022; H02M 1/0048; H02M 1/126; H02M 1/08
See application file for complete search history.

(56) References Cited

U.S. PATENT DOCUMENTS

| | | |
|---|---|---|
| 8,681,077 B2 | 3/2014 | Kimura |
| 9,871,451 B2 | 1/2018 | Lin et al. |
| 10,277,843 B2 | 4/2019 | Smith et al. |
| 10,650,766 B2 | 5/2020 | Kurokawa et al. |
| 11,187,763 B2 | 11/2021 | Schmitt et al. |
| 2005/0110562 A1 | 5/2005 | Robinson et al. |
| 2006/0092715 A1 | 5/2006 | Braun et al. |
| 2012/0112837 A1 | 5/2012 | Dally et al. |
| 2015/0016154 A1 | 1/2015 | Wang et al. |
| 2017/0179940 A1 | 6/2017 | Hu et al. |
| 2019/0199212 A1* | 6/2019 | Jiang ........................ H02M 1/08 |

OTHER PUBLICATIONS

WOISR (Written Opinion & International Search Report) for corresponding PCT/US2024/024606, mailed Aug. 1, 2024.

* cited by examiner

*Primary Examiner* — Joseph J Lauture
(74) *Attorney, Agent, or Firm* — Tarolli, Sundheim, Covell &Tummino LLP

(57) ABSTRACT

A recovery circuit includes a buffer and filter module that receives a sampled signal with droops between spikes over an interval of time from a sample and hold circuit and outputs a conditioned signal that has droops. The recovery circuit includes an alternating current (AC) inverter and extractor module that removes a direct current (DC) component of the conditioned signal and provides an inverted AC component signal that has signal boosts with an equal magnitude and duration to the droops in the conditioned signal. The recovery circuit also includes a summing amplifier that combines the conditioned signal and the inverted AC component signal to provide a output signal that has a nearly constant voltage over the interval of time.

20 Claims, 5 Drawing Sheets

RECOVERY CIRCUIT

GOVERNMENT INTEREST

The invention was made under Government Contract. Therefore, the US Government has rights to the invention as specified in that contract.

TECHNICAL FIELD

This description relates to a recovery circuit of a sample and hold circuit.

BACKGROUND

A sample and hold circuit is an electronic circuit employed to sample an analog signal at a particular instant in time and hold that value for an interval of time. A sample and hold circuit is employable in analog-to-digital converters (ADCs) to capture an analog signal and convert the analog signal into a digital signal that can be processed by a digital system.

The basic operation of a sample and hold circuit involves two stages: a sampling stage and a holding stage. In the sampling stage, the input analog signal is briefly connected to a capacitor, which charges up to the input voltage level. This captures a sample of the input signal at a particular instant in time. In the holding stage, a switch connecting the input analog signal to the capacitor is opened, and the voltage on the capacitor is held constant by a buffer amplifier. This allows the analog signal to be "frozen" in time and held at a constant level for an interval of time, so that the analog signal can be accurately measured or converted to a digital signal.

SUMMARY

A first example relates to a recovery circuit that includes a buffer and filter module that receives a sampled signal with droops between spikes over an interval of time from a sample and hold circuit and outputs a conditioned signal that has droops. The recovery circuit also includes an alternating current (AC) inverter and extractor module that removes a direct current (DC) component of the conditioned signal and provides an inverted AC component signal that has signal boosts with an equal magnitude and duration to the droops in the conditioned signal. The recovery circuit includes a summing amplifier that combines the conditioned signal and the inverted AC component signal to provide a output signal that has a nearly constant voltage over the interval of time.

A second example relates to a sample and hold recovery circuit (SHARC) including a sample and hold circuit that provides a sampled signal over an interval of time responsive to an input signal and a trigger signal. The sampled signal has droops between voltage spikes coincident with pulses in the trigger signal. The SHARC also includes a recovery circuit having a buffer and filter module that receives the sampled signal and outputs a conditioned signal that has droops between boosts over the interval of time. The recovery circuit also includes an AC inverter and extractor module that removes a DC component of the conditioned signal and provides an inverted AC component signal that has signal boosts with an equal magnitude and duration to the droops in the conditioned signal. The recovery circuit further includes a summing amplifier that combines the conditioned signal and the inverted AC component signal to provide a output signal that has a nearly constant voltage over the interval of time.

A third example relates to a power supply including a controller that provides a control signal. The power supply also has a digital to analog converter (DAC) that provides a plurality of input signals responsive to the control signal. The input signals have voltages that vary by at least 5% over an interval of time. The power supply also includes a plurality of sample and hold recovery circuits that provide respective output signals responsive to the plurality of input signals. The output signals have voltages that vary by 0.002% or less over the interval of time.

DETAILED DESCRIPTION

This disclosure relates to a sample and hold recovery circuit (SHARC). The SHARC includes a sample and hold circuit that provides a sampled signal over an interval of time (e.g., at least 0.2 seconds) responsive to an input signal and a trigger signal. More particularly, the voltage of the sampled signal varies by about 5% to about 10% (e.g., about 8%) or more over the interval of time. The sampled signal has droops between voltage spikes coincident with pulses in the trigger signal. The sample and hold circuit can be implemented with a conventional sample and hold circuit, such as a sample and hold circuit with a capacitor of about 10 microfarads (µF) or less.

The SHARC also includes a recovery circuit with a buffer and filter module that receives the sampled signal and outputs a conditioned signal that has droops between boosts (crescents) over the interval of time. The conditioned signal has droops relative to a mean coincident with the droops of the samples signal. The recovery circuit also includes an alternating current (AC) inverter and extractor module that extracts the alternating current (AC) component of the conditioned signal by removing a direct current (DC) component of the conditioned signal and provides an inverted AC component signal that has signal boosts relative to the mean with an equal magnitude and duration to the droops in the conditioned signal. That is, the inverted AC component signal and the conditioned signal resemble mirror images of each other. The recovery circuit also includes a summing amplifier that combines the conditioned signal and the inverted AC component signal to provide an output signal (alternatively referred to as a recovered signal) that has a nearly constant voltage over the interval of time. The nearly constant voltage is about equal to the mean, in some examples, the nearly constant voltage of the output signal varies by 0.002% or less over the interval of time. Accordingly, the recovery circuit of the SHARC compensates for the droops in the voltage over the interval of time, without requiring a large capacitor in the sample and hold circuit.

Figure 1:
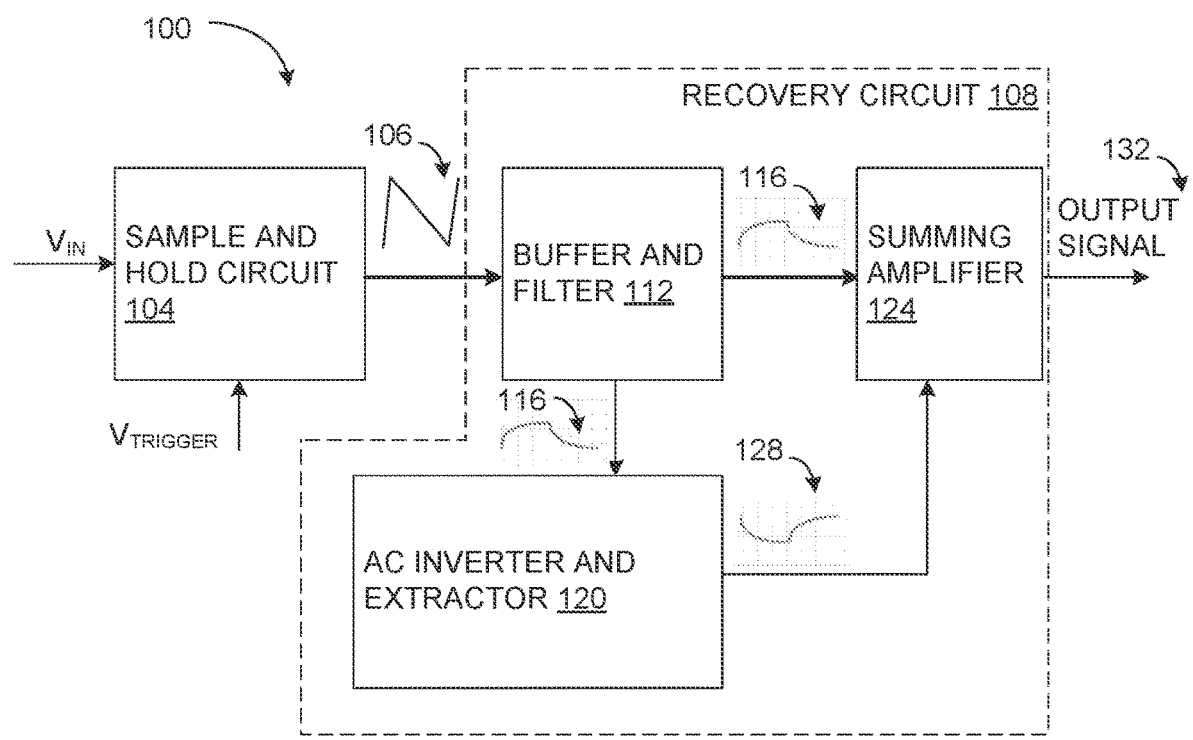
FIG. 1 is a block diagram of a sampled and hold recovery circuit (SHARC).

FIG. 1 is a block diagram of a SHARC 100. The SHARC 100 includes a sample and hold circuit 104 that receives an analog input voltage, $V_{IN}$ and a trigger signal, $V_{TRIGGER}$. The sample and hold circuit 104 is a conventional sample and hold circuit. The sample and hold circuit 104 is configured to capture and hold an the input voltage $V_{IN}$ a specific instant in time defined by the trigger signal, $V_{TRIGGER}$. The sample and hold circuit 104 outputs a signal with a voltage about equal to the input voltage at that instant in time for a period of time.

More particularly, the sample and hold circuit 104 has two operations, a sampling operation and a holding operation. In the sampling operation, the input voltage, $V_{IN}$ is sampled at a specific instant in time. The holding operation can be executed by a switch that connects the input voltage, $V_{IN}$ to a sampling capacitor. In the holding operation, in response to the input voltage, $V_{IN}$ being sampled, a switch controlled by the trigger signal, $V_{TRIGGER}$, disconnects a sampling capacitor from the input voltage, $V_{IN}$, and the capacitor holds the sampled voltage level. The output of the sample and hold circuit is the voltage level held on the capacitor, which is typically buffered by an operational amplifier (op-amp) to provide a sampled signal 106, which is a low impedance output.

As the capacitor of the sample and hold circuit 104 discharges (during the hold operation) the voltage output of the sample and hold circuit 104 decreases, which decrease is referred to as droop. The droop rate depends on the discharge time constant of the capacitor, which is determined by the value of the capacitor and an input resistance of the buffer amplifier. Droop can be curtailed by using a larger value capacitor or a buffer amplifier with a lower input resistance, but this can lead to other issues such as slower settling time or increased noise. The sampled signal 106 is represented as a sawtooth wave to demonstrate this droop. Accordingly, the sampled signal 106 includes spikes and droops over an interval of time (e.g., 0.2 seconds or more). The sampled signal has a voltage that varies by about 5% to about 15% or more, such as about 8% in some examples that is based on the interval of time.

Accordingly, to compensate for the droop of the sample and hold circuit 104, the SHARC 100 includes a recovery circuit 108. The recovery circuit includes a buffer and filter 112 (a buffer and filter module) that receives the sampled signal 106 of the sample and hold circuit 104. The buffer and filter 112 is a circuit that buffers the sampled signal 106 of the sample and hold circuit 104 and filters out unwanted noise and/or frequency components from the sampled signal 106. The buffer component of the buffer and filter 112 isolates the sampled signal 106 from a load and conditions the sampled signal 106. The filter component of the buffer and filter 112 removes unwanted frequency components from the sampled signal 106 to output a conditioned signal 116. The conditioned signal 116 is output to an AC inverter and extractor 120 and to a summing amplifier 124. The conditioned signal 116 has droops between boosts about a mean value over the interval of time.

The AC inverter and extractor 120 (AC inverter and extractor module) removes (filters) the DC component of the conditioned signal 116 to provide an AC signal. This AC signal is inverted and output as an inverted AC component signal 128. As used herein, the term, "inverted AC component signal" refers to a signal that is a mirror image of another signal relative to a mean value (e.g., a mirror image of the conditioned signal 116 over the mean value). Thus, the inverted AC component signal 128 has boosts in time intervals that the conditioned signal has droops and has droops in time intervals that the conditioned signal has boosts (crescents).

The summing amplifier 124 combines (in an additive operation), the conditioned signal 116 and the inverted AC component signal 128 to produce an output signal 132 that has a voltage that is about equal to the mean value of the conditioned signal 116 and the inverted AC component signal 128. The summing amplifier 124 includes an op-amp and input resistors. The op-amp sums the AC difference between the conditioned signal 116 and the inverted AC component signal 128 that are connected to the inverting input of the op-amp through input resistors. The output the op-amp of the summing amplifier 124 is the output signal 132.

In operation, as the sampled signal 106 droops, the conditioned signal 116 has a corresponding droop (falling signal) and boost (rising signal). However, the inverted AC component signal 128 has a boost (rising signal) concurrently with the droop of the conditioned signal 116 (because the inverted AC component signal 128 has an inverted polarity relative to the conditioned signal 116 relative to a mean value) and a droop concurrently with a boost of the conditioned signal 116. Because the AC component polarity of the conditioned signal 116 and the inverted AC component signal 128 are opposite, the AC difference between the conditioned signal 116 and the inverted AC component signal 128 (corresponding to the output signal 132) is equal to the input signal, $V_{IN}$ without droop during the hold interval of time of the sample and hold circuit 104. That is, the output signal 132 curtails the droop in the sampled signal 106 without requiring an increase in a capacitance of the sample capacitor and hold circuit 104 and/or without lowering the input impedance of the op-amp of the sample and hold circuit 104. Accordingly, the recovery circuit 108 is employable to improve the operational performance of the sample and hold circuit 104.

Figure 2A:
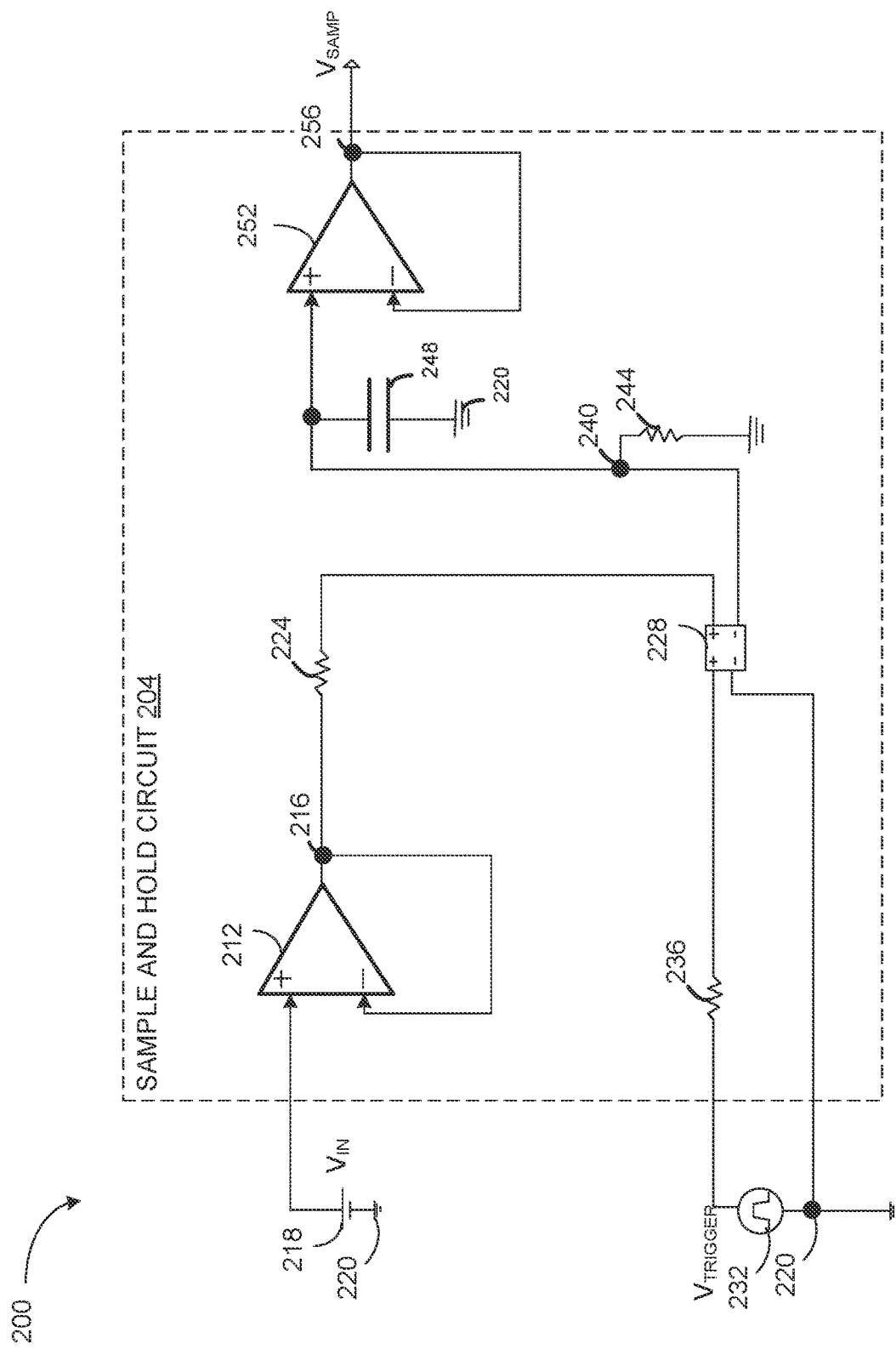
FIGS. 2A and 2B illustrate a circuit diagram of a SHARC.
Figure 2B:
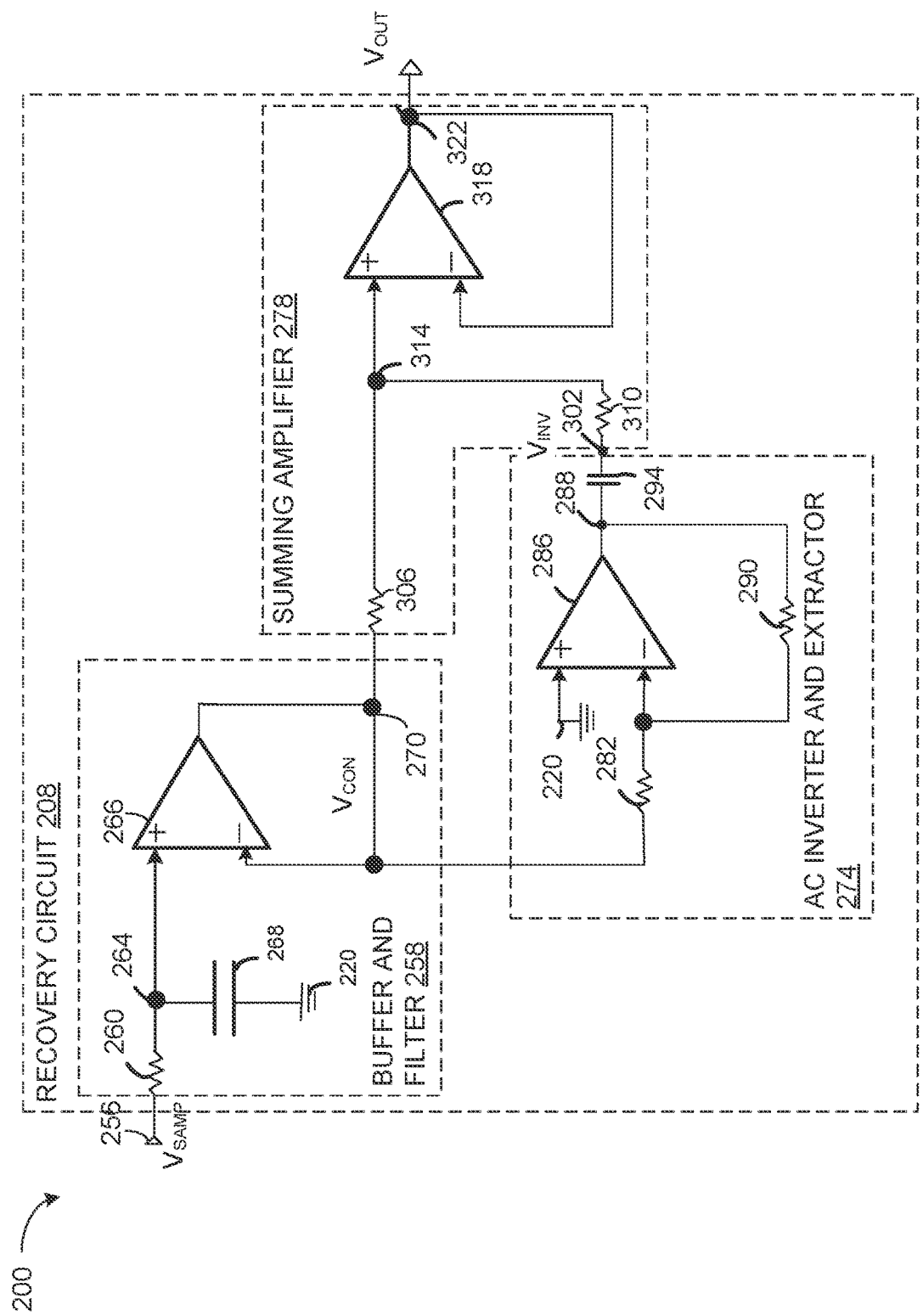

FIGS. 2A and 2B illustrate an example circuit diagram of a SHARC 200 that is employable to implement the SHARC 100 of FIG. 1. More particularly, FIG. 2A illustrates a sample and hold circuit 204 that provides a sampled signal, $V_{SAMP}$, and FIG. 2B illustrates a recovery circuit 208 that provides an output signal, $V_{OUT}$ (alternatively referred to as a recovery signal) in response to the sampled signal, $V_{SAMP}$.

The sample and hold circuit 204 is employable to implement the sample and hold circuit 104 of FIG. 1. The sample and hold circuit 204 includes an input op-amp 212 connected as a buffer, such that an output terminal of the input op-amp 212 and an inverting input of the input op-amp 212 are coupled to a node 216. The non-inverting input of the input op-amp 212 is coupled to an analog input voltage, $V_{IN}$. The input voltage, $V_{IN}$ is provided from a DC voltage source 218 that is coupled to an electrically neutral node 220 (e.g., ground). In some examples, the DC voltage source 218 is representative of an output of a digital-to-analog converter (DAC).

The term "couple" is used throughout the specification. The term may cover connections, communications, or signal paths that enable a functional relationship consistent with the description of this disclosure. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A through the control signal generated by device A.

The node 216 is coupled to a resistor 224. The resistor 224 has a resistance of about 10 Ohms. Unless otherwise stated, in this description, 'about' preceding a value means+/−10 percent of the stated value. The resistor 224 is coupled to a positive input terminal of a switch 228 of the sample and hold circuit 204. The switch 228 can be implemented with a transmission gate, also known as a pass gate. Accordingly, the switch 228 can be implemented with a pair of complementary field effect transistors (FETs), such as one N-channel FET (N-FET) and one P-channel FET (P-FET). The switch 228 is controlled by a trigger signal, $V_{TRIGGER}$, generated by control logic for the SHARC 200. The trigger signal, $V_{TRIGGER}$, determines the duration of the sample period and the hold period, and ensures that the switch 228 opens and closes at the correct times. More particularly, the trigger signal, $V_{TRIGGER}$, is provided from a pulse voltage source 232 that is coupled in series with a resistor 236 and to the electrically neutral node 220. The resistor 236 has a resistance of about 200 Ohms in some examples, and is coupled to a positive control node of the switch 228. A negative control node of the switch 228 is coupled to the electrically neutral node 220. An output terminal (e.g., a negative terminal) of the switch 228 is coupled to a capture node 240.

The capture node 240 is coupled to a resistor 244, a capacitor 248 and a non-inverting input of an op-amp 252. The resistor 244 has a resistance of about 10 megaohms (MΩ). The resistor 244 represents a leakage current. The capacitor 248 can have a capacitance of about 10 microfarads (µF) or less. The op-amp 252 is connected in a buffer configuration, such that an output terminal and an inverting input of the op-amp 252 are coupled to a sample node 256.

In operation, the sample and hold circuit 204 has two stages, a sampling stage and a holding stage. During the sampling stage, the trigger signal, $V_{TRIGGER}$ IS pulsed (high voltage stage), and the input voltage, $V_{IN}$ is connected to the capacitor 248 through the switch 228, allowing the capacitor 248 to charge to the value of the input voltage, $V_{IN}$. The duration of the sampling stage is controlled by a period of the trigger signal, $V_{TRIGGER}$. As one example, the trigger signal, $V_{TRIGGER}$ has a pulse width of about 1 millisecond (ms).

In response to the trigger signal, $V_{TRIGGER}$ going to a low voltage state, the sampling stage is completed, and the switch 228 is opened, disconnecting the output of the input op-amp 212 and the op-amp 252. Additionally, in response the capacitor 248 holds as charge with a voltage provided to the op-amp 252, such that the output of the op-amp 252 on the sample node 256 is a sampled signal, $V_{SAMP}$. However, as the capacitor 248 discharges during the holding stage (when the trigger signal, $V_{TRIGGER}$ iS at a low stage), the sampled signal, $V_{SAMP}$ also drops, causing droop in the output of the sample and hold circuit 204.

To compensate for the droop in the sampled signal, $V_{SAMP}$, the SHARC 200 include the recovery circuit 208 illustrated in FIG. 2B. The recovery circuit 208 includes a buffer and filter 258 (a buffer and filter module). The buffer and filter 258 includes a resistor 260 coupled to the sample node 256. The resistor 260 is also coupled to a node 264 that is coupled to a non-inverting input of an op-amp 266 and a capacitor 268 of the buffer and filter 258. The resistor 260 has a resistance of about 10 kilohms (kΩ). The capacitor 268 has a capacitance that is equal to the capacitance of the capacitor 248, namely about 1 µF or less, in some examples. The capacitor 268 is also coupled to the electrically neutral node 220. The op-amp 266 is configured as a buffer, such that an output terminal and a non-inverting input of the op-amp 266 are coupled to a node 270. The voltage at the node 270 is a conditioned signal, $V_{CON}$.

In operation, the buffer and filter 258 buffers the sampled signal, $V_{SAMP}$ output by the sample and hold circuit 204 and filters out unwanted noise and/or frequency components from the sampled signal, $V_{SAMP}$ to provide the conditioned signal, $V_{CON}$ at the node 270.

The conditioned signal, $V_{CON}$ is provided to an AC inverter and extractor 274 and to a summing amplifier 278. The AC inverter and extractor 274 (AC inverter an extractor module) includes a resistor 282 coupled to the node 270. The resistor 282 can have a resistance of about 2 kΩ. The resistor 282 is also coupled to an inverting input of an op-amp 286. A non-inverting input of the op-amp 286 is coupled to the electrically neutral node 220. An output terminal of the op-amp 286 is coupled to a node 288 that is coupled to a feedback resistor 290 that is coupled between the output terminal and the inverting input of the op-amp 286. The feedback resistor 290 has a resistance about equal to the resistance of the resistor 282, such that the feedback resistor 290 has a resistance of about 2 kΩ, in some examples. The node 288 is also coupled to a capacitor 294. The capacitor 294 has a capacitance of about equal to the capacitance of the capacitor 268, namely about 10 µF or less. The capacitor 294 is also coupled to a node 302 that provides an inverted AC component signal, $V_{INV}$ as the output of the AC inverter and extractor 274.

In operation, the AC inverter and extractor 274 is configured to remove a DC component of the conditioned signal, $V_{CON}$ and to invert droops and boosts of the conditioned signal, $V_{CON}$ to form a boost in the inverted AC component signal, $V_{INV}$ at the node 302. The boosts in the inverted AC component signal, $V_{INV}$ mirrors the droops in the conditioned signal, $V_{CON}$. Additionally, droops in the inverted AC component signal, $V_{INV}$ mirror boosts in the conditioned signal, $V_{CON}$.

The conditioned signal, $V_{CON}$ on the node 270 (the output of the buffer and filter 258) and the inverted AC component signal, $V_{INV}$ on the node 302 (the output of the AC inverter and extractor 274) are provided to the summing amplifier 278. More particularly, the node 270 (with the conditioned signal, $V_{CON}$) is coupled to a resistor 306 of the summing amplifier 278 and the node 302 (with the inverted AC component signal, $V_{INV}$) is coupled to a resistor 310 of the summing amplifier 278. The resistor 306 and the resistor 310 have the same resistance, such as a resistance of about 10 kΩ. The resistor 306 and the resistor 310 are also coupled to a node 314 that is coupled to a non-inverting input of an op-amp 318 of the summing amplifier 278. The op-amp 318 is configured as a buffer, such that an output terminal of the op-amp 318 and an inverting input of the op-amp 318 are coupled to an output node 322 of the summing amplifier 278. Accordingly, the non-inverting input of the op-amp 318 receives a portion of the conditioned signal, $V_{CON}$ and a portion of the inverted AC component signal, $V_{INV}$. The output node of the op-amp 318 provides an output signal, $V_{OUT}$ (alternatively referred to as a recovered signal) for the SHARC 200.

In operation, the summing amplifier 278 combines the conditioned signal, $V_{CON}$ with the inverted AC component signal, $V_{INV}$. Because the inverted AC component signal, $V_{INV}$ has boosts during intervals of time that the conditioned signal, $V_{CON}$ has droops, and because the inverted AC component signal, $V_{INV}$ has droops during intervals of time that the conditioned signal has boosts, the boosts and the droop cancel each other out to form the output signal, $V_{OUT}$, which has a nearly constant voltage.

Figure 3:
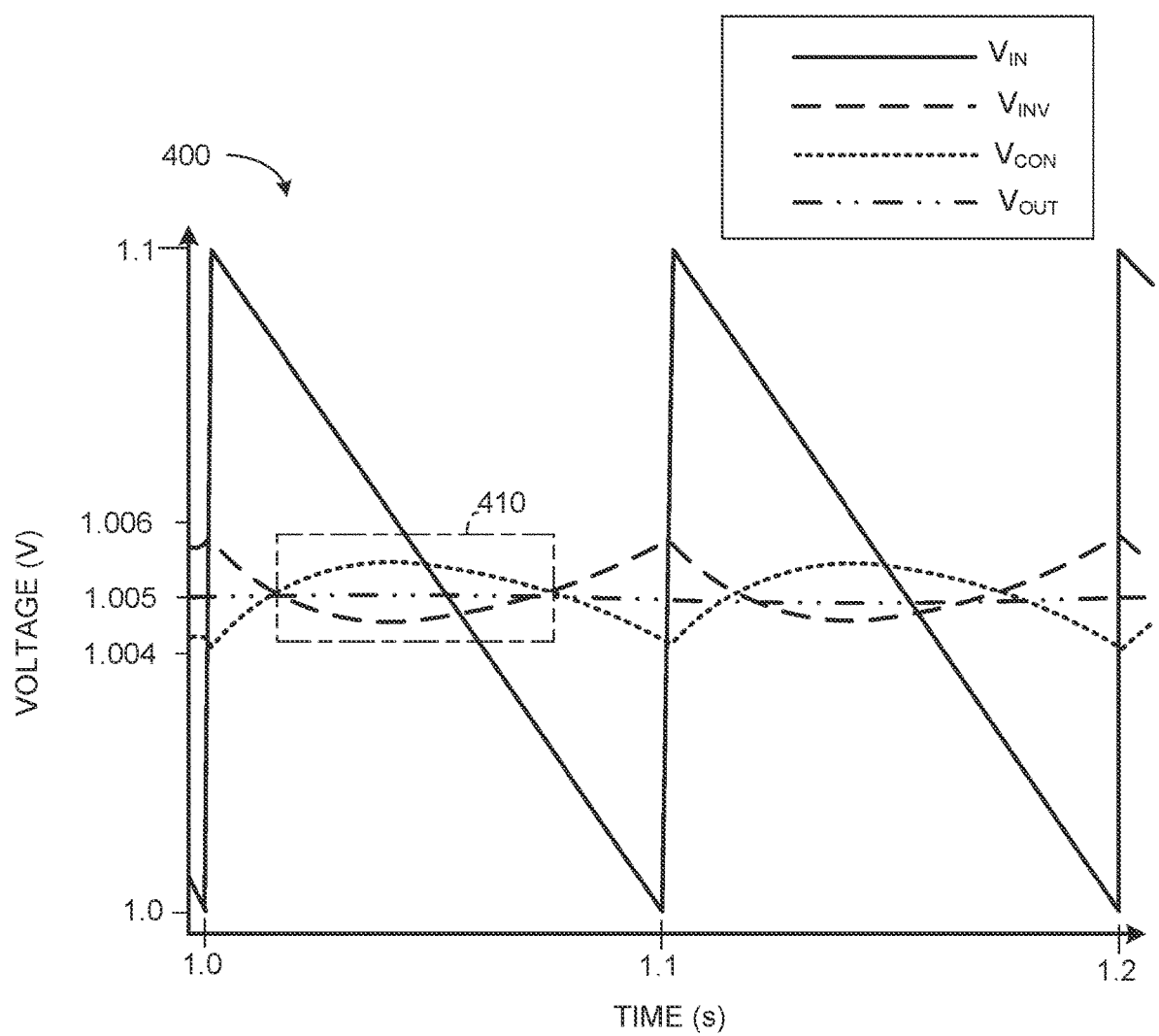
FIG. 3 illustrates a graph that plots a voltage as a function of time of signals of the SHARC of FIGS. 2A and 2B.

FIG. 3 illustrates a graph 400 that plots a voltage in volts (V) of signals in the SHARC 200 as a function of time in microseconds (µs) over an interval of time. In the example illustrated, the interval of time is 0.2 seconds. In other examples the interval of time is longer or shorter. As illustrated in the graph 400, the sampled signal, $V_{SAMP}$ (e.g., at the sample node 256 in FIG. 2A and FIG. 2B) has a sawtooth shape that oscillates between 1.0 V and 1.1 V. More particularly, the sampled signal, $V_{SAMP}$ has droops between voltage spikes coincident with pulses in the trigger signal, $V_{TRIGGER}$.

Additionally, the conditioned signal, $V_{CON}$ (e.g., at the node 270 of FIG. 2B) oscillates between about 1.0055 V and 1.0045 V. The conditioned signal, $V_{CON}$ has droops and boosts relative to a mean value about 1.005 V. Further, the inverted AC component signal, $V_{INV}$ also oscillates between about 1.0055 V and 1.0045 V. The inverted AC component signal, $V_{INV}$ has boosts and droops coincident about the mean value. The boosts of the inverted AC component signal, $V_{INV}$ are coincident with the droops of the conditioned signal, $V_{CON}$ and the droops of the inverted AC component signal, $V_{INV}$ are coincident with boosts of the conditioned signal, $V_{CON}$. In this manner, the conditioned signal, $V_{CON}$ and the inverted AC component signal, $V_{INV}$ are mirror images of each other. Additionally, the output signal, $V_{OUT}$ has the mean value, and varies by less than 0.0001 V.

As another explanation, consider a segment 410 of the graph 400. In the segment 410, as is illustrated, droop in the sampled signal, $V_{SAMP}$ causes a boost followed by a droop in the same region of the conditional signal, $V_{CON}$ (because of the charging and discharging of the capacitor 268), such that the conditioned signal has a parabolic shape in the segment 410. However, the inverted AC component signal, $V_{INV}$ has a droop followed by a boost over the same segment 410, and this droop and boost have an opposite magnitude as the boost and droop in the conditioned signal, $V_{CON}$. Consequently, summing the conditioned signal, $V_{CON}$ and the inverted AC component signal, $V_{INV}$ forms the output signal, $V_{OUT}$ that compensates for the droop in the sampled signal, $V_{SAMP}$. Thus, rather than a conventional sample signal with a variance in voltage of 10% (because the sampled signal, $V_{SAMP}$ varies between 1.0 V and 1.1V), the output signal, $V_{OUT}$ has a variance of about 0.002%. Accordingly, as illustrated by the graph 400, the SHARC 200 of FIGS. 2A and 2B is employable to provide a highly accurate output voltage, and provides considerable performance improvement over a conventional sample and hold circuit, such as the sample and hold circuit 104 of FIG. 1 and/or the sample and hold circuit 204 of FIG. 2A.

Figure 4:
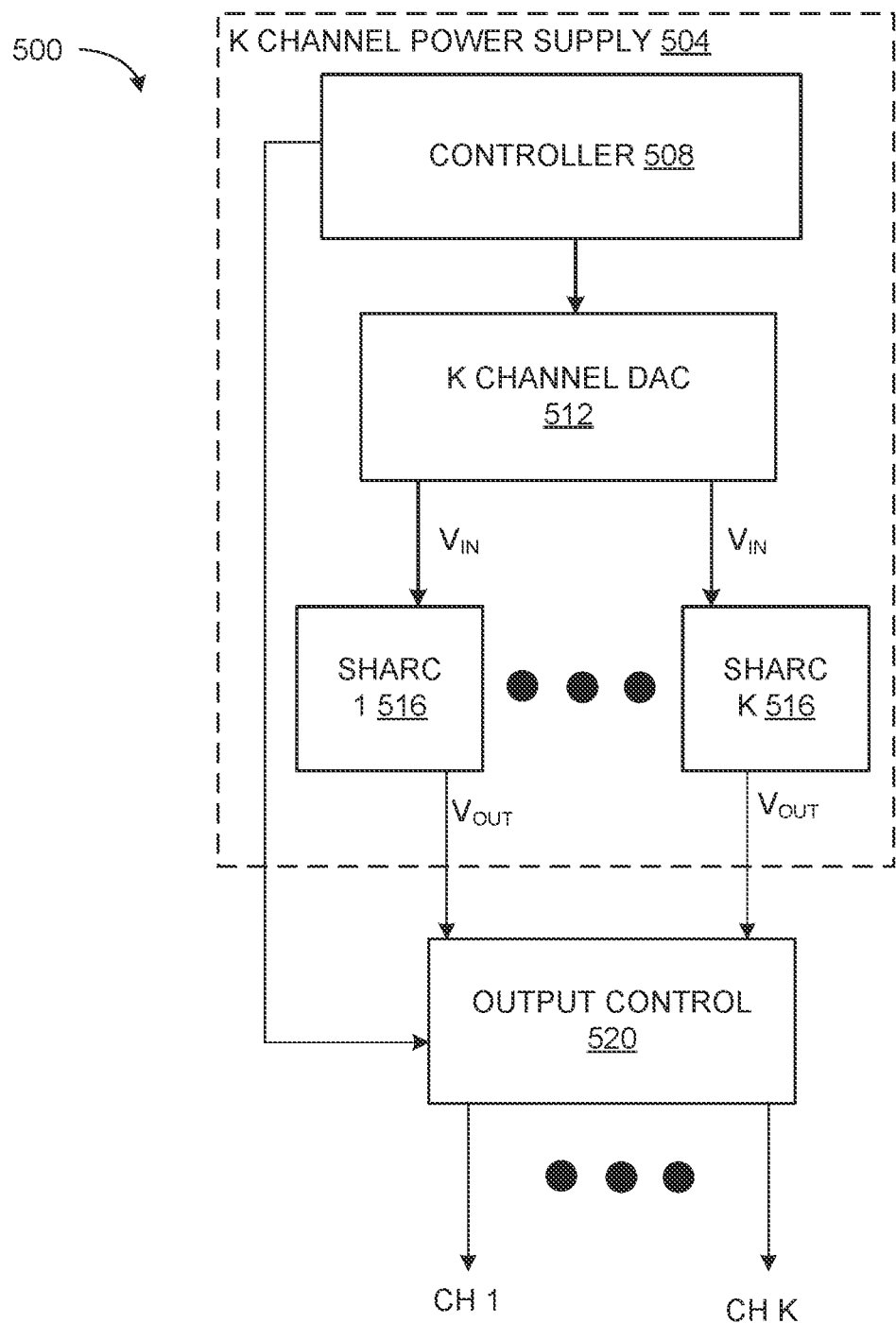
FIG. 4 illustrates a system that includes a multichannel power supply.

FIG. 4 illustrates a system 500 that includes a K channel power supply 504, where K is an integer greater than one, such that the K channel power supply is a multichannel power supply. In some examples, K is an integer greater or equal to eighty, such as one-hundred or more. The K channel power supply 504 includes a controller 508, such as a microcontroller. The K channel power supply 504 includes a K channel DAC 512. The K channel power supply 504 also includes K number of SHARCs 516 (labeled SHARC 1 . . . . SHARC K) coupled to the K channel DAC 512. The K number of SHARCs 516 are implemented with the SHARC 100 of FIG. 1 and/or the SHARC 200 of FIGS. 2A and 2B.

The controller 508 provides a K channel DAC 512 with a control signal. Responsive to the control signal, the K channel DAC 512 provides an input signal, $V_{IN}$ to a corresponding SHARC 516. The K channel DAC 512 can be a 8-20 bit DAC in various examples. The controller 508 and the K channel DAC 512 are configured such that the K channel DAC 512 pulses the input signal, $V_{IN}$ in sequence (e.g., from SHARC 1 516 to SHARC K 516). In some examples, each input signal, $V_{IN}$ has a waveform similar to the waveform of the input signal, $V_{IN}$ illustrated in FIG. 4.

Responsive to the input signal, $V_{IN}$, the K number of SHARCs 516 provide a corresponding output signal, $V_{OUT}$ (such as the output signal, $V_{OUT}$ illustrated and described in FIGS. 2A, 2B and 3). More particularly, a given SHARC 516 (e.g., SHARC 1 to SHARC K) samples the input signal, $V_{IN}$ and generates the output signal, $V_{OUT}$ that compensates for droop in an intermediate sampled signal, $V_{SAMP}$, as explained with respect to FIGS. 1, 2A, 2B and 3.

The output signal, $V_{OUT}$ is provided to an output control 520 that is controlled by the controller 508. The output control could include, for example, an amplifier to adjust a current and/or voltage of each output signal, $V_{OUT}$. The output control 520 can generate K number of channel outputs (labeled CH 1 . . . . CH K) that are employable to drive loads.

What have been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications and variations that fall within the scope of this application, including the appended claims. As used herein, the term "includes" means includes but not limited to, the term "including" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

What is claimed is:

1. A recovery circuit comprising:
    a buffer and filter module that receives a sampled signal with droops between spikes over an interval of time from a sample and hold circuit and outputs a conditioned signal that has droops;
    an alternating current (AC) inverter and extractor module that removes a direct current (DC) component of the conditioned signal and provides an inverted AC component signal that has signal boosts with an equal magnitude and duration to the droops in the conditioned signal; and
    a summing amplifier that combines the conditioned signal and the inverted AC component signal to provide a output signal that has a nearly constant voltage over the interval of time.

2. The recovery circuit of claim 1, wherein the interval of time is at least 0.2 seconds.

3. The recovery circuit of claim 2, wherein the output signal has a voltage that varies by about 0.002% or less over the interval of time.

4. The recovery circuit of claim 3, wherein the sampled signal varies by at least 8% over the interval of time.

5. The recovery circuit of claim 1, wherein the buffer and filter module comprises a given capacitor with a capacitance equal to a capacitance of another capacitor of the sample and hold circuit.

6. The recovery circuit of claim 5, wherein the AC inverter and extractor module comprises an operational amplifier (op-amp) that receives a portion of the conditioned signal at an inverting input of the op-amp.

7. The recovery circuit of claim 6, wherein the op-amp is a given op-amp, and the summing amplifier comprises another op-amp that receives a portion of the conditioned signal and a portion of the inverted AC component signal at a non-inverting input of the other op-amp.

8. The recovery circuit of claim 5, wherein the capacitance of the given capacitor has a capacitance of 10 microfarads or less.

9. A sample and hold recovery circuit comprising:
a sample and hold circuit that provides a sampled signal over an interval of time responsive to an input signal and a trigger signal, wherein the sampled signal has droops between voltage spikes coincident with pulses in the trigger signal; and
a recovery circuit comprising:
a buffer and filter module that receives the sampled signal and outputs a conditioned signal that has droops and boosts over the interval of time;
an alternating current (AC) inverter and extractor module that removes a direct current (DC) component of the conditioned signal and provides an inverted AC component signal that has signal boosts with an equal magnitude and duration to the droops in the conditioned signal; and
a summing amplifier that combines the conditioned signal and the inverted AC component signal to provide a output signal that has a nearly constant voltage over the interval of time.

10. The sample and hold recovery circuit of claim 9, wherein the interval of time is at least 0.2 seconds.

11. The sample and hold recovery circuit of claim 10, wherein the output signal has a voltage that varies by about 0.002% or less over the interval of time.

12. The sample and hold recovery circuit of claim 11, wherein the sampled signal varies by at least 8% over the interval of time.

13. The sample and hold recovery circuit of claim 9, wherein the buffer and filter module comprises a given capacitor with a capacitance equal to a capacitance of another capacitor of the sample and hold circuit.

14. The sample and hold recovery circuit of claim 13, wherein the AC inverter and extractor module comprises an operational amplifier (op-amp) that receives a portion of the conditioned signal at an inverting input of the op-amp.

15. The sample and hold recovery circuit of claim 14, wherein the op-amp is a given op-amp, and the summing amplifier comprises another op-amp that receives a portion of the conditioned signal and a portion of the inverted AC component signal at a non-inverting input of the other op-amp.

16. The sample and hold recovery circuit of claim 13, wherein the capacitance of the other capacitor is 10 microfarads or less.

17. A power supply comprising:
a controller that provides a control signal;
a digital to analog converter (DAC) that provides a plurality of input signals responsive to the control signal, wherein the plurality of input signals have voltages that vary by at least 5% over an interval of time; and
a plurality of sample and hold recovery circuits that provide respective output signals responsive to the plurality of input signals, wherein the output signals have voltages that vary by 0.002% or less over the interval of time.

18. The power supply of claim 17, wherein the interval of time is at least 0.2 seconds.

19. The power supply of claim 17, wherein the plurality of sample and hold recovery circuits comprises at least 80 sample and hold recovery circuits.

20. The power supply of claim 17, wherein each of the plurality of sample and hold recovery circuits comprises a capacitor with a capacitance of 10 microfarads or less.

* * * * *